United States Patent [19]

Rai et al.

[11] Patent Number: 5,397,864
[45] Date of Patent: Mar. 14, 1995

[54] WIRING BOARD AND A METHOD FOR PRODUCING THE SAME

[75] Inventors: Akiteru Rai, Nara; Keiji Yamamura, Sakurai, both of Japan

[73] Assignee: Sharp Kabushiki Kaisha, Osaka, Japan

[21] Appl. No.: 978,235

[22] Filed: Nov. 18, 1992

[30] Foreign Application Priority Data

Nov. 20, 1991 [JP] Japan .................. 3-332411

[51] Int. Cl.⁶ .............................. H05K 1/00
[52] U.S. Cl. ..................... 174/261; 174/260; 174/266; 174/268; 361/767; 361/772; 361/810; 361/813
[58] Field of Search ............. 174/260, 262, 266, 268; 228/179, 180.1, 180.2; 361/760, 767, 772, 774, 777, 783, 807, 808, 810, 813

[56] References Cited

U.S. PATENT DOCUMENTS

| | | |
|---|---|---|
| 3,614,832 | 10/1971 | Chance et al. |
| 4,859,808 | 8/1989 | Jeter et al. |
| 5,061,988 | 10/1991 | Rector |
| 5,288,950 | 2/1994 | Ushio et al. |

FOREIGN PATENT DOCUMENTS 3305952  8/1984  Germany.

OTHER PUBLICATIONS

F. Soga: "Handbook for Semiconductor Mounting," pp. 128–138, Sep. 25, 1986, Flip Chip Bonding w/partial English translation.

Ichikawa et al, Okidenki Research and Development, 138, vol. 55, No. 2, pp. 51–56, Apr. 1988, "Flip-Chip Joining Technique for 400DPI Thermal Printing Heads" w/partial English translation.

Primary Examiner—Leo P. Picard
Assistant Examiner—Cheryl R. Figlin
Attorney, Agent, or Firm—Nixon & Vanderhye

[57] ABSTRACT

A wiring board including a plate; at least one conductive strip provided on the plate, the conductive strip having a specified connection position; and an electrically insulating film covering the conductive strip and having a slit extending in a direction crossing the longitudinal direction of the conductive strip. A tip of the conductive strip in the vicinity of the connection position has a distance from the connection position in a longitudinal direction of the conductive strip. The slit is formed at a position corresponding to the connection position.

11 Claims, 6 Drawing Sheets

Fig. 1a
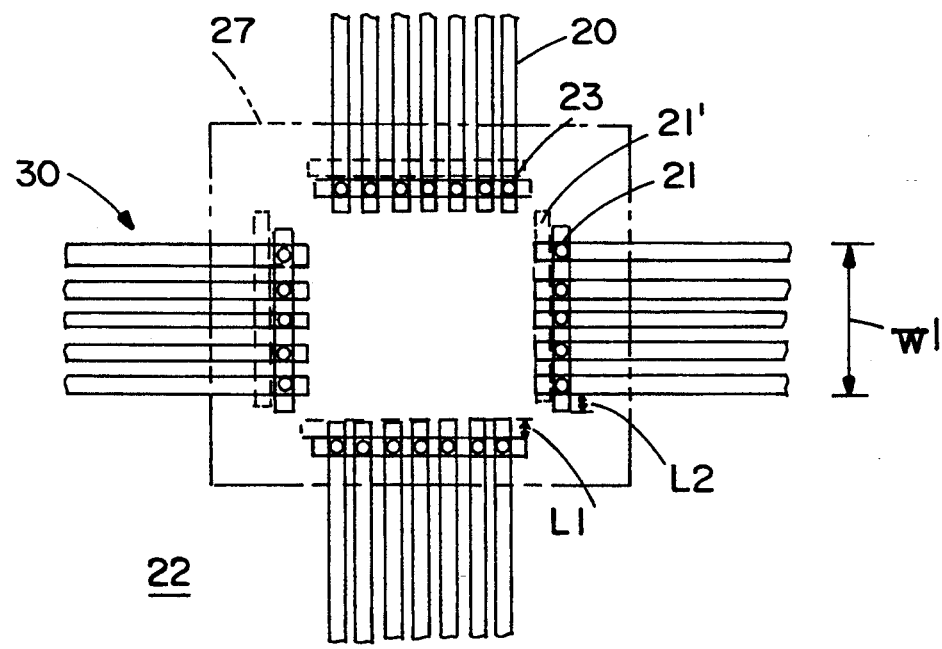
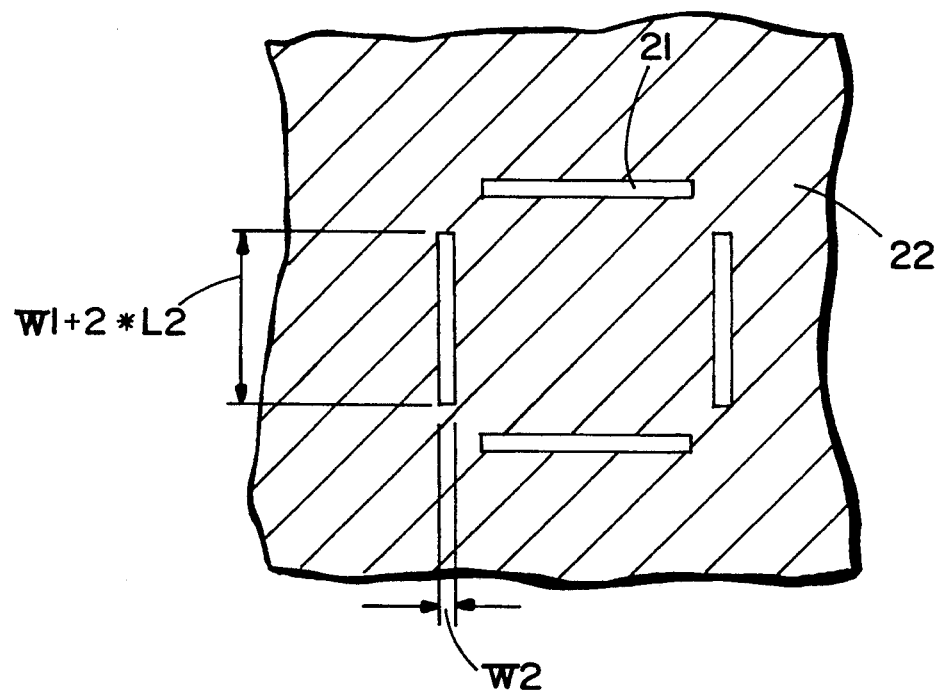
Fig. 1b

Fig. 2
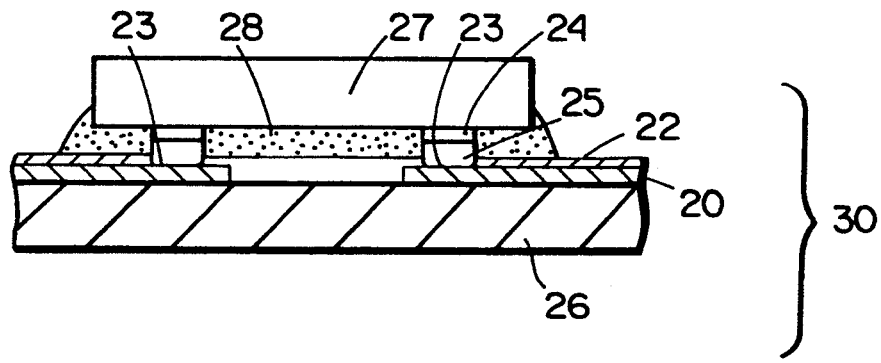
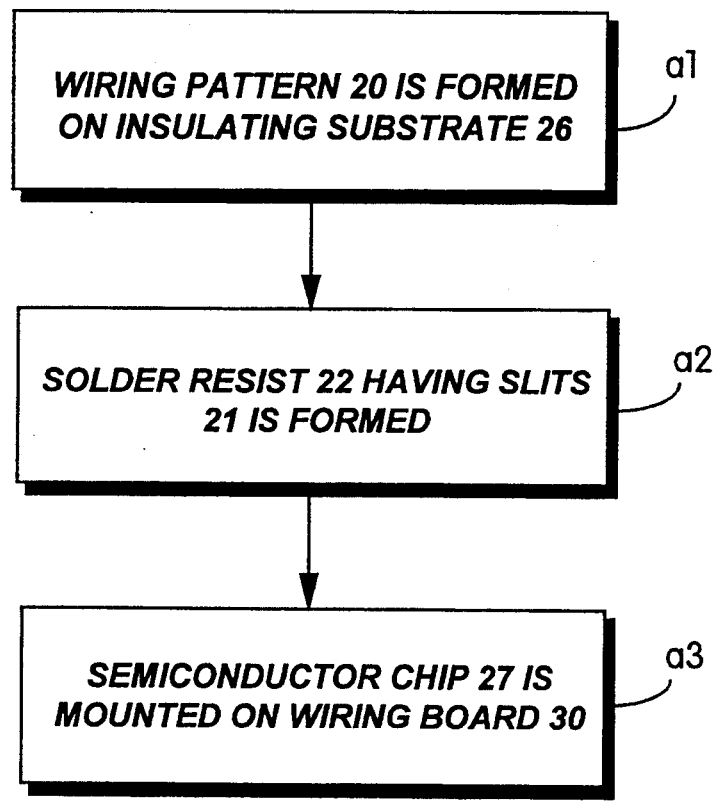
Fig. 3

30a

30b

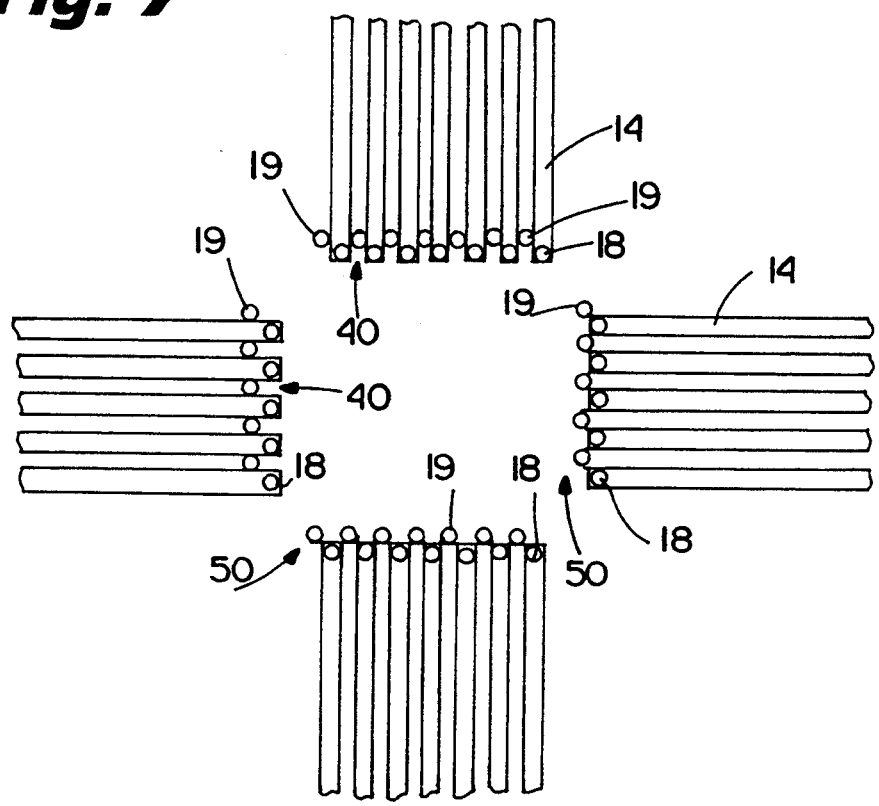

WIRING BOARD AND A METHOD FOR PRODUCING THE SAME

BACKGROUND OF THE INVENTION

1. Field of the Invention:

The present invention relates to a wiring board on which an electronic component is mounted by a flip chip bonding system and to a method for producing such a wiring board.

2. Description of the Related Art:

In recent years, the size of semiconductor devices has been reduced more, and accordingly, the number of terminals of a semiconductor device has remarkably been increased. In mounting a semiconductor chip on a wiring board, therefore, it has become difficult to microscopically connect terminals of the semiconductor chip to the wiring board by conventional wire bonding. Today, the wire bonding system is replaced with a flip chip bonding system.

FIG. 5 is a cross sectional view of a wiring board 17 on which a semiconductor chip 10 is mounted by use of a flip chip bonding system. The semiconductor chip 10 having bumps 12 is mounted on the wiring board 17 by face down bonding. The bumps 12 are formed of solder, gold or the like and are provided on pads 11 on the semiconductor chip 10. The wiring board 17 includes an electrically insulating plate 13 and a specified wiring pattern 14 provided thereon. The semiconductor chip 10 is connected to the wiring pattern 14. The semiconductor chip 10 and the wiring board 17 are fixed and the connection therebetween is secured by an adhesive layer 15 provided therebetween and formed of a resin or the like. Such a conventional flip chip bonding system is described in "Handbook for Semiconductor Mounting" (published on Sep. 25, 1986; pp. 128–138).

In FIG. 5, portions of a surface of the wiring pattern 14 act as bonding pads 18, to which the bumps 12 of the semiconductor chip 10 are connected by soldering. The bonding pads 18 and the vicinity thereof are formed of a metal which can easily be soldered. In order to prevent solder from flowing out through the bonding pads 18, a solder dam structure is employed, by which the wiring board 17 including the wiring pattern 14 is prevented from being touched with solder except for the bonding pads 18. The solder dam structure is constructed by forming an insulating film such as a solder resist 16 on a surface of the insulating plate 13 having the wiring pattern 14 thereon, except for the bonding pads 18, as is shown by a two-dot chain line of FIG. 5. The solder resist 16 is generally patterned by use of a printing process or a photographic process. Thus, the above-mentioned flowing-out of solder are prevented.

FIG. 6a is a plan view of the wiring board 17 having the above-mentioned conventional solder dam structure. The solder resist 16 is formed on the insulating plate 13 having the wiring pattern 14 thereon except for the bonding pads 18. Each bonding pad 18 has a width W3 of approximately 100 μm. FIG. 6b is a plan view of the solder resist 16, which has substantially circular holes 19 at positions corresponding to the bonding pads 18. Such a solder dam structure having substantially circular holes is described in "Okidenki Research and Development, 138, Vol. 55, No. 2" (published in April 1988; pp. 51–56).

The above solder dam structure has a problem in that it is extremely difficult to form the microscopic bonding pads 18 with high precision by use of a printing process. For example, if the pattern shown in FIG. 6b is formed with a positional deviation of approximately 100 μm, the holes 19 are made at positions 40 between wirings of the wiring pattern 14, or at positions 50 having a distance from leading edges of the bonding pads 18 as is shown in FIG. 7. With such a wiring board, the connection between the semiconductor chip 10 and the wiring pattern 14 is possibly defective or broken, resulting in a low reliability in terms of connection.

When a photographic process is used for patterning the solder resist 16, the positional deviation of the holes 19 is avoided due to the highly precise positioning of the photographic process. However, formation of the solder dam structure requires a complicated production procedure and a long period of time, thus increasing the production cost of the wiring board.

SUMMARY OF THE INVENTION

A wiring board according to the present invention includes a plate; at least one conductive strip provided on the plate, the conductive strip having a specified connection position; and an electrically insulating film covering the conductive strip and having a slit extending in a direction crossing the longitudinal direction of the conductive strip. A tip of the conductive strip in the vicinity of the connection position is a distance from the connection position in a longitudinal direction of the conductive strip. The slit is formed at a position corresponding to the connection position.

A method for producing a wiring board according to the present invention includes the steps of forming at least one conductive strip on a plate, the conductive strip having a connection position, so that a tip of the conductive strip in the vicinity of the connection position is a distance from the connection position in a longitudinal direction of the conductive strip; and forming an electrically insulating film for covering the conductive strip. The electrically insulating film has a slit at a position corresponding to the connection position. The slit is extended in a direction crossing the longitudinal direction of the conductive strip.

Thus, the invention described herein makes possible the advantages of providing a wiring board with a solder dam structure which has reliability in terms of electrical connection and can be produced in a simple way at low cost and a method for producing such a wiring board.

These and other advantages of the present invention will become apparent to those skilled in the art upon reading and understanding the following detailed description with reference to the accompanying figures.

BRIEF DESCRIPTION OF THE DRAWINGS

FIG. 1a is a plan view of a wiring board according to an example of the present invention.

FIG. 1b is a plan view of a solder resist used in the wiring board of FIG. 1.

FIG. 2 is a cross sectional view of the wiring board of FIG. 1, on which a semiconductor chip is mounted.

FIG. 3 is a flow chart for producing the wiring board with the semiconductor chip of FIG. 2.

FIG. 6b is a plan view of a solder resist used in the wiring board of FIG. 6a.

FIG. 7 is a view showing a positional deviation in the wiring board of FIG. 5.

DESCRIPTION OF THE PREFERRED EMBODIMENTS

Figure 4A:
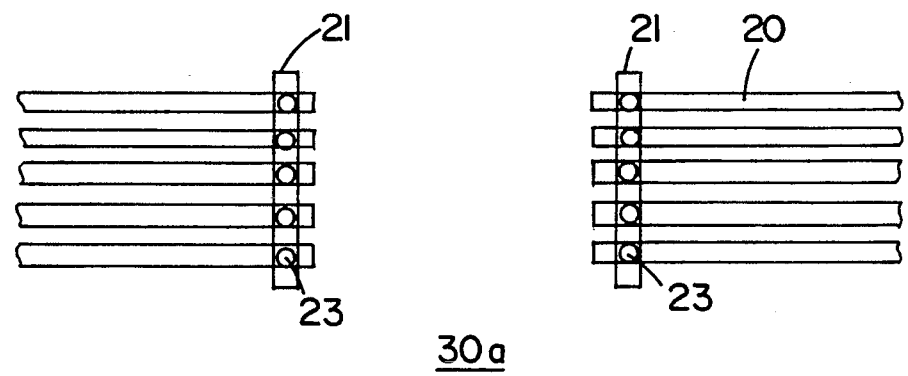
FIGS. 4a and 4b show modifications of wiring patterns according to the present invention.

Hereinafter, the present invention will be described by way of illustrating examples with reference to the accompanying drawings.

FIG. 1a is a plan view of a wiring board 30 according to an example of the present invention; FIG. 1b is a plan view of a solder resist 22 used in the wiring board 30; FIG. 2 is a cross sectional view of the wiring board 30 on which a semiconductor chip 27 is mounted; and FIG. 3 is a flow chart for producing the wiring board 30 with the semiconductor chip 27.

Referring to FIG. 2, the semiconductor chip 27 having bumps 25 is mounted on the wiring board 30 by face down bonding according to a flip chip bonding system of this example. The bumps 25 are formed of solder, gold or the like and are provided on pads 24 on the semiconductor chip 27. The wiring board 30 includes an electrically insulating plate 26 and a specified wiring pattern 20 provided thereon. The semiconductor chip 27 is connected with the wiring pattern 20. The semiconductor chip 27 and the wiring board 30 are fixed and the connection therebetween is secured by an adhesive layer 28 provided therebetween and formed of a resin or the like.

In FIG. 2, portions of a surface of the wiring pattern 20 act as bonding pads 23, to which the bumps 25 of the semiconductor chip 27 are connected by soldering. The bonding pads 23 and the vicinity thereof are formed of a metal which can easily be soldered, In order to prevent solder from flowing-out through the bonding pads 23, a novel solder dam structure is employed, by which the wiring board 30 including the wiring pattern 20 is prevented from being touched with solder except for the bonding pads 23. The solder dam structure is constructed by forming an insulating film such as a solder resist 22, formed of an epoxy resin for example, on a surface of the insulating plate 26 having the wiring pattern 20 thereon, except for the bonding pads 23 which are connected with the bumps 25 by soldering. The solder resist 22, which is patterned as described later, is formed by use of either a printing process or a photographic process.

A method for producing the wiring board 30 will be described with reference to FIGS. 1a, 1b and 3.

In step a1, the wiring pattern 20 is formed on the insulating plate 26 as is shown in FIG. 1a. Namely, a group of wirings are provided for each side of the rectangular semiconductor chip 27. Each group of wirings has a total width W1 between ends of outermost wirings thereof. The wirings are each formed so that an end portion thereof to be connected to the semiconductor chip 27 be extended from the bonding pad 23 by a length L1.

In step a2, the solder resist 22 is formed by a screen printing technique. As is shown in FIG. 1b, the resist 22 has four slits 21 respectively along the sides of the semiconductor chip 27, through which the bonding pads 23 are connected with the bumps 25. Each slit 21 has a width W2 and a length which is longer than the total width W1 of the corresponding group of wirings by a length L2 at both ends of the slit 21 in a longitudinal direction thereof. In other words, the length of the slit 21 is W1+2*L2. The lengths L1 and L2 are, for example, 100 μm each.

In step a3, the semiconductor chip 27 is mounted on the wiring board 30 through the bumps 25 and the bonding pads 23.

Forming the wiring pattern 20 and the solder resist 22 in such a pattern has the following advantages. Even if the solder resist 22 is printed on the insulating plate 26 with a positional deviation of approximately 100 μm with respect to the wiring pattern 20, a slit 21' (dashed line in FIG. 1a) is still made on all the corresponding wirings. Accordingly, the bumps 25 can still be connected with the pads 23 through the slit 21'. Thus, the positional deviation causes no inconvenience in mounting the semiconductor chip 27 on the insulating plate 26. As a result, the semiconductor chip 27 can be mounted on the wiring board 30 having solder dam structures at positions accurately corresponding to the bonding pads 23, thereby preventing defective connection between the wiring pattern 20 and the semiconductor chip 27.

Figure 4B:
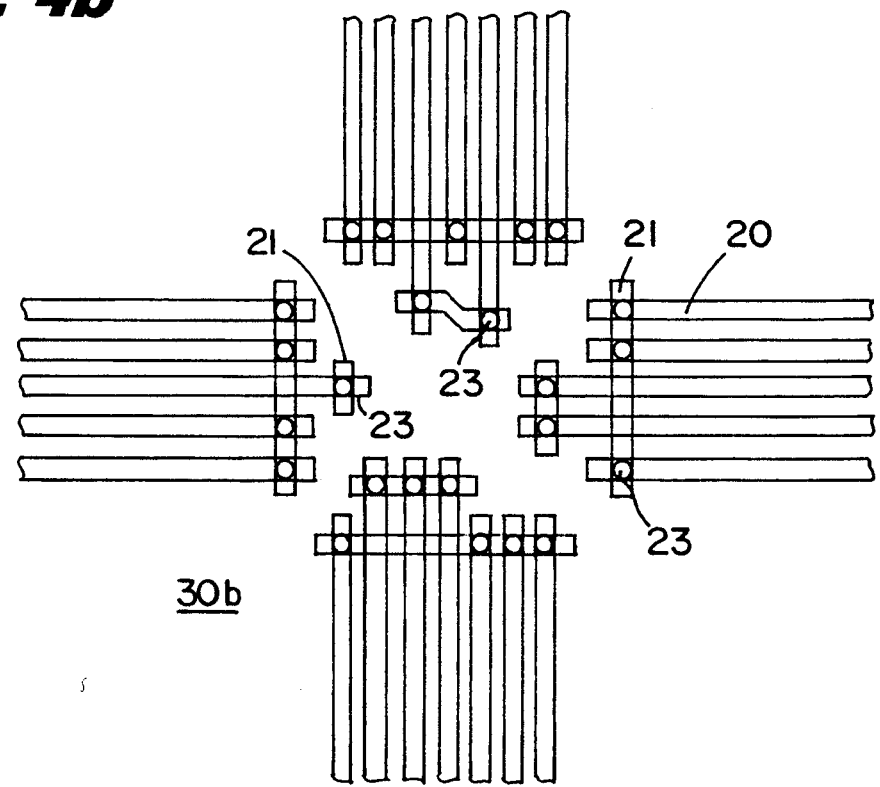
Figure 5:
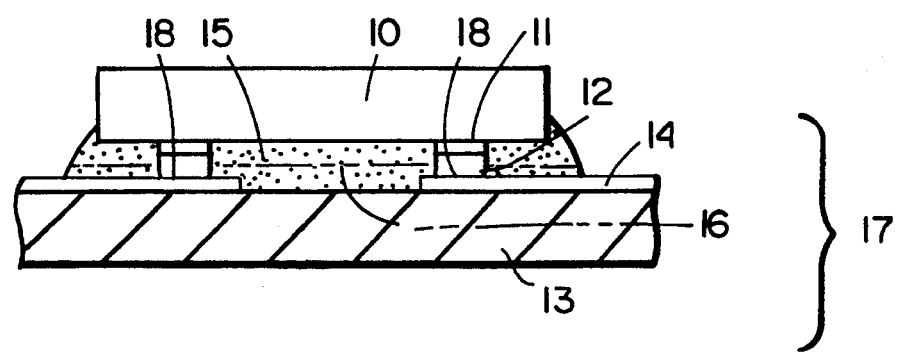
FIG. 5 is a cross sectional view of a wiring board on which a semiconductor chip is mounted according to a conventional example.
Figure 6A:
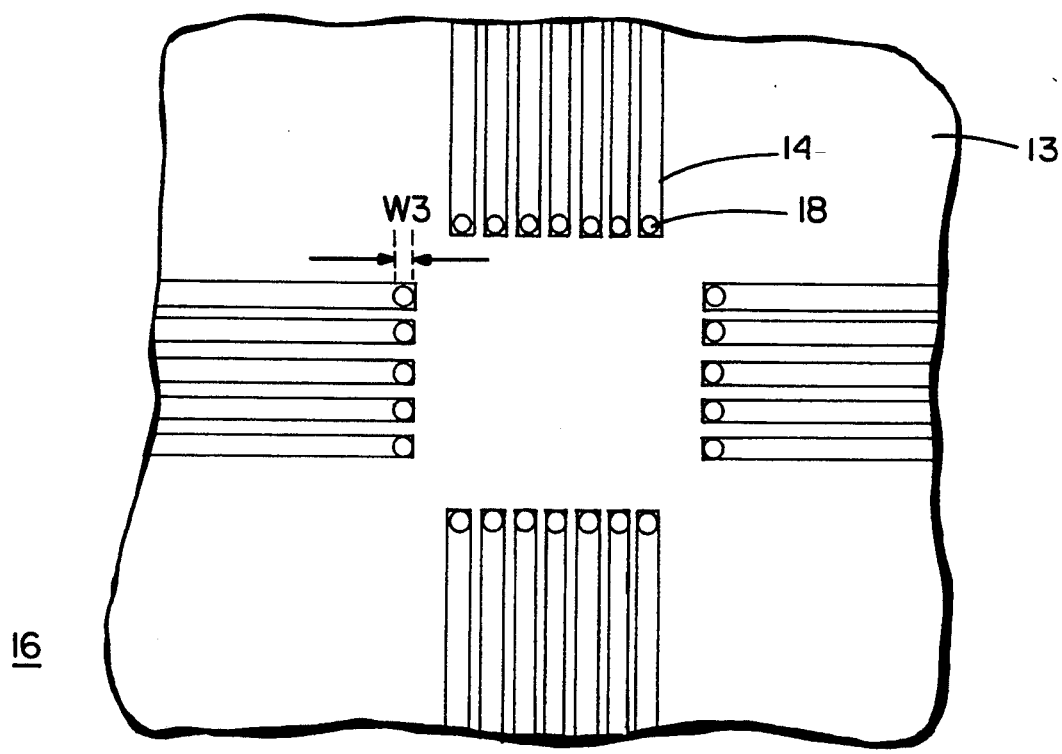
FIG. 6a is a plan view of the wiring board of FIG. 5.
Figure 6B:
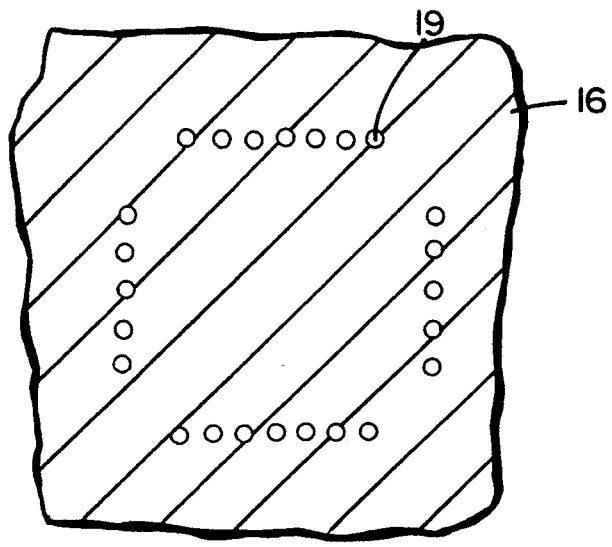

FIGS. 4a and 4b show modifications of the wiring pattern arrangement according to the present invention. The elements which are identical with those of the preceding example bear the identical reference numerals.

FIG. 4a shows a wiring board 30a on which a semiconductor chip having solder bumps along two sides thereof is mounted by flip chip bonding. FIG. 4b shows a wiring board 30b on which a semiconductor chip having solder bumps over an entire bottom surface of the wiring board 30b as well as the peripheral portions thereof is mounted by flip chip bonding. In either case, the wiring pattern 20 is formed on the wiring board 30a, 30b, and the solder resist is formed so as to cover at least the wiring pattern 20. The solder resist has slits at positions corresponding to the pads 23 of the wiring pattern 20.

A wiring board and a method for producing the wiring board according to the present invention can be used not only for mounting a semiconductor chip but for mounting various electric circuit devices or electronic circuit devices.

The solder dam structure may be constructed by use of a wide variety of electrically insulating materials as well as solder resist. The wirings of the wiring patterns are not necessarily arranged so as to be parallel to each other, but may be converged to a connection position of an insulating plate from a periphery thereof.

According to the present invention, in whichever direction a solder resist having slits may be deviated in forming a solder dam structure, the solder resist has a space and the wiring pattern has an area, both for compensating for the deviation. Therefore, the bonding pads with a satisfactory shape exist at positions corresponding to the slit. As a result, flip chip bonding can be performed with highly precise positioning, thereby improving reliability in terms of throughput of mounting and electrical connection.

Further according to the present invention, since a printing process can be used to form a solder dam structure at a microscopic bonding pad, the production cost can be lowered. Moreover, a wiring board including bonding pads in a higher density can easily be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A wiring board, comprising:
a plate; a plurality of first conductive strips provided on the plate;
a plurality of second conductive strips provided on the plate; a solder resist covering each first and second conductive strip and the plate,
wherein the solder resist has a first and a second slit extending in a direction crossing a longitudinal direction of the first and second conductive strips, respectively,
wherein each first conductive strip has a front portion extending a distance from one side of the first slit, a connection portion exposed through the first slit, and a rear portion extending in a direction opposite from the front portion; and
each second conductive strip has a front portion extending a distance from one side of the slit, a connection portion exposed through the second slit, and a rear portion extending in a direction opposite from the front portion,
wherein the longitudinal direction of each of the first conductive strips is substantially perpendicular to the longitudinal direction of each of the second conductive strips,
wherein the solder resist covers the front portion and the rear portion of the first conductive strips and the front portion and the rear portion of the second conductive strips, and the first slit extends in a direction crossing the longitudinal direction of the first conductive strips and the second slit extends in a direction crossing the longitudinal direction of the second conductive strips, and
wherein the connecting portions of each of the first and second conductive strips are formed of a material which is easily soldered.

2. A wiring board according to claim 1, wherein a length of the first slit in a longitudinal direction is longer than a length between the ends of the outermost of the plurality of first conductive strips, and a length of the second slit in a longitudinal direction is longer than a length between the ends of the outermost of the plurality of second conductive strips.

3. A wiring board according to claim 1, wherein the plurality of the first conductive strips are substantially parallel to each other and the plurality of the second conductive strips are substantially parallel to each other.

4. A wiring board according to claim 1, wherein each of a plurality of first regions include the front portion of a first conductive strip, the connecting portion of a first conductive strip and the rear portion of a first conductive strip, and the portions of each first region form a straight line,
wherein each of a plurality of second regions includes the front portion of a second conductive strip, the connecting portion of a second conductive strip and the rear portion of a second conductive strip, and the portions of each second region form a straight line,
wherein the front portions of each first conductive strip form a straight line substantially perpendicular to each first conductive strip, the connecting portions of each first conductive strip form a straight line substantially perpendicular to each first conductive strip, the rear portions of each first conductive strip form a straight line substantially perpendicular to each first conductive strip, and
wherein the front portions of each second conductive strip form a straight line substantially perpendicular to each second conductive strip, the connecting portions of each second conductive strip form a straight line substantially perpendicular to each second conductive strip, the rear portions of each second conductive strip form a straight line substantially perpendicular to each second conductive strip.

5. A wiring board according to claim 1, wherein the plurality of first conductive strips are straight,
wherein each of the plurality of second conductive strips are straight,
wherein each of the plurality of first conductive strips are substantially parallel with each other, and
wherein each of the plurality of second conductive strips are substantially parallel with each other.

6. A wiring board, comprising:
a plate;
a plurality of first conductive strips provided on the plate;
a plurality of second conductive strips provided on the plate;
a solder resist covering the first and second conductive strips and the plate,
wherein the solder resist has a first and a second slit extending in a direction crossing the longitudinal direction of the first and second conductive strips, respectively,
wherein each first conductive strip has a connecting portion exposed through the first slit; and
each second conductive strip has a connecting portion exposed through the second slit,
wherein the longitudinal direction of each of the first conductive strips is substantially perpendicular to the longitudinal direction of each of the second conductive strips,
wherein the solder resist covers the first conductive strips on both sides of the first slit and the second conductive strips on both sides of the second slit without covering the connecting portions of each of the first and second conductive strips,
wherein the connecting portions of each of the first and second conductive strips are formed of a material which is easily soldered,
wherein a portion of the first conductive strips adjacent the first connecting portions, forms a straight line,
wherein a portion of the connecting portions of the second conductive strips, adjacent the connecting portions forms a straight line,
wherein each of the first conductive strips, adjacent the first connecting portions, is substantially parallel with each other, and
wherein each of second conductive strips, adjacent the second connecting portions, is substantially parallel with each other.

7. A wiring board, comprising:
a plate;
a plurality of first conductive strips provided on the plate, the plurality of first conductive strips including an outer group and a second group;
a plurality of second conductive strips provided on the plate, the plurality of second conductive strips including an outer group and a second group;

a solder resist covering the first and second conductive strips and the plate, wherein the solder resist has an outer first slit extending in a direction crossing the longitudinal direction of each of the first conductive strips, an outer second slit extending in a direction crossing the longitudinal direction of each of the second conductive strips, an inner first slit extending in a direction crossing the longitudinal direction of each of the first conductive strips, and an inner second slit extending in a direction crossing the longitudinal direction of each of the second conductive strips, wherein the outer group of the plurality of first conductive strips includes outer first connecting portions exposed through the outer first slit, and the inner group of the plurality of first conductive strips includes inner first connecting portions exposed through the inner first slit, wherein the outer group of the plurality of second conductive strips includes outer second connecting portions exposed through the outer second slit, and the inner group of the plurality of second conductive strips includes inner second connecting portions exposed through the inner second slit, wherein the longitudinal direction of each of the first conductive strips is substantially perpendicular to the longitudinal direction of each of the second conductive strips, wherein the solder resist covers each of the first conductive strips and the second conductive strips without covering the outer first connecting portions of the first conductive strips, the inner first connecting portions of the first conductive strips, the inner second connecting portions of the second conductive strips, and the inner second connecting portions of the second conductive strips, wherein the outer first slit is substantially parallel with the inner first slit, and the outer second slit is substantially parallel with the inner second slit, and wherein the connecting portions of each of the first and second conductive strips are formed of a material which is easily soldered.

8. A wiring board according to claim 7, wherein a length of the outer first slit in a longitudinal direction is longer than a length of the inner first slit, and the length of the outer second slit in a longitudinal direction is longer than the length of the inner second slit.

9. A wiring board according to claim 1, wherein the solder resist cover the whole area of the plate except for the first slit and the second slit.

10. A wiring board according to claim 6, wherein the solder resist covers the whole area of the plate except for the first slit and the second slit.

11. A wiring board according to claim 7, wherein the solder resist covers the whole area of the plate except for the outer first slit, the inner first slit, the outer second slit and the inner second slit.

* * * * *